United States Patent
Meir et al.

(10) Patent No.: US 11,728,833 B2
(45) Date of Patent: Aug. 15, 2023

(54) MULTI-USER DIGITAL POST DISTORTION

(71) Applicant: QUALCOMM Incorporated, San Diego, CA (US)

(72) Inventors: Elad Meir, Ramat Gan (IL); Gideon Shlomo Kutz, Ramat Hasharon (IL); Amit Bar-Or Tillinger, Tel-Aviv (IL); Tal Oved, Modiin (IL); Yaron Laufer, Brookline, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/646,343

(22) Filed: Dec. 29, 2021

(65) Prior Publication Data

US 2023/0208457 A1 Jun. 29, 2023

(51) Int. Cl.
*H04L 5/00* (2006.01)
*H04B 1/04* (2006.01)
*H04W 72/044* (2023.01)
*H04W 72/23* (2023.01)

(52) U.S. Cl.
CPC ......... *H04B 1/0475* (2013.01); *H04L 5/0023* (2013.01); *H04W 72/046* (2013.01); *H04W 72/23* (2023.01); *H03F 2200/451* (2013.01)

(58) Field of Classification Search
CPC . H04W 72/042; H04W 8/24; H04W 52/0258; H04W 52/365; H04W 52/367; H04W 72/082; H04W 76/27; H04W 80/02; H04L 25/0226; H04L 25/03343; H04L 25/03019; H04L 7/0091; H04L 25/03006; H04L 5/0023; H04L 1/0039; H04L 25/49; H04B 1/0475; H04B 1/109; H04B 1/123; H04B 2001/0425; H04B 7/0456; H04B 17/14; H04B 17/13; H04B 7/0639; H04B 1/12
USPC ......................................................... 375/262
See application file for complete search history.

(56) References Cited

U.S. PATENT DOCUMENTS

| | | | |
|---|---|---|---|
| 8,948,325 B1* | 2/2015 | Warner | H04B 1/0475 375/297 |
| 2014/0064348 A1* | 3/2014 | Braz | H04B 1/12 375/350 |
| 2019/0052311 A1* | 2/2019 | Murugesu | H04L 27/367 |
| 2019/0190552 A1* | 6/2019 | Sagi | H03F 3/24 |

* cited by examiner

*Primary Examiner* — Eva Y Puente
(74) *Attorney, Agent, or Firm* — Qualcomm Incorporated

(57) ABSTRACT

Various aspects of the present disclosure generally relate to wireless communication. In some aspects, a user equipment (UE) may receive one or more indications of parameters associated with one or more downlink communications transmitted to one or more additional UEs. The UE may receive a downlink communication, including applying digital post distortion (DPoD) correction based at least in part on measurements of the one or more downlink communications transmitted to the one or more additional UEs and the one or more indications of the parameters. Numerous other aspects are described.

30 Claims, 8 Drawing Sheets

MULTI-USER DIGITAL POST DISTORTION

FIELD OF THE DISCLOSURE

Aspects of the present disclosure generally relate to wireless communication and to techniques and apparatuses for multi-user digital post distortion.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a user equipment (UE). The method may include receiving one or more indications of parameters associated with one or more downlink communications transmitted to one or more additional UEs. The method may include receiving a downlink communication, including applying digital post distortion (DPoD) correction based at least in part on measurements of the one or more downlink communications transmitted to the one or more additional UEs and the one or more indications of the parameters.

Some aspects described herein relate to a method of wireless communication performed by a base station. The method may include transmitting, to a UE, one or more indications of parameters associated with one or more downlink communications transmitted to one or more additional UEs. The method may include transmitting a downlink communication. The method may include receiving hybrid automatic repeat request (HARD) acknowledgment (HARQ-ACK) feedback for the downlink communication based at least in part on the UE applying DPoD correction that is based at least in part on measurements of the one or more downlink communications transmitted to the one or more additional UEs and the one or more indications of the parameters.

Some aspects described herein relate to a UE for wireless communication. The user equipment may include a memory and one or more processors coupled to the memory. The one or more processors may be configured to receive one or more indications of parameters associated with one or more downlink communications transmitted to one or more additional UEs. The one or more processors may be configured to receive a downlink communication, including applying DPoD correction based at least in part on measurements of the one or more downlink communications transmitted to the one or more additional UEs and the one or more indications of the parameters.

Some aspects described herein relate to a base station for wireless communication. The base station may include a memory and one or more processors coupled to the memory. The one or more processors may be configured to transmit, to a UE, one or more indications of parameters associated with one or more downlink communications transmitted to one or more additional UEs. The one or more processors may be configured to transmit a downlink communication. The one or more processors may be configured to receive HARQ-ACK feedback for the downlink communication based at least in part on the UE applying DPoD correction that is based at least in part on measurements of the one or more downlink communications transmitted to the one or more additional UEs and the one or more indications of the parameters.

Some aspects described herein relate to a non-transitory computer-readable medium that stores a set of instructions for wireless communication by a UE. The set of instructions, when executed by one or more processors of the UE, may cause the UE to receive one or more indications of parameters associated with one or more downlink communications transmitted to one or more additional UEs. The set of instructions, when executed by one or more processors of the UE, may cause the UE to receive a downlink communication, including applying DPoD correction based at least in part on measurements of the one or more downlink communications transmitted to the one or more additional UEs and the one or more indications of the parameters.

Some aspects described herein relate to a non-transitory computer-readable medium that stores a set of instructions for wireless communication by a base station. The set of instructions, when executed by one or more processors of the base station, may cause the base station to transmit, to a UE, one or more indications of parameters associated with one or more downlink communications transmitted to one or more additional UEs. The set of instructions, when executed by one or more processors of the base station, may cause the base station to transmit a downlink communication. The set of instructions, when executed by one or more processors of the base station, may cause the base station to receive HARQ-ACK feedback for the downlink communication based at least in part on the UE applying DPoD correction that is based at least in part on measurements of the one or more downlink communications transmitted to the one or more additional UEs and the one or more indications of the parameters.

Some aspects described herein relate to an apparatus for wireless communication. The apparatus may include means for receiving one or more indications of parameters associated with one or more downlink communications transmitted to one or more additional UEs. The apparatus may include means for receiving a downlink communication, including applying DPoD correction based at least in part on measurements of the one or more downlink communications transmitted to the one or more additional UEs and the one or more indications of the parameters.

Some aspects described herein relate to an apparatus for wireless communication. The apparatus may include means for transmitting, to a UE, one or more indications of parameters associated with one or more downlink communications transmitted to one or more additional UEs. The apparatus may include means for transmitting a downlink communication. The apparatus may include means for receiving HARQ-ACK feedback for the downlink communication based at least in part on the UE applying DPoD correction that is based at least in part on measurements of the one or more downlink communications transmitted to the one or more additional UEs and the one or more indications of the parameters.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
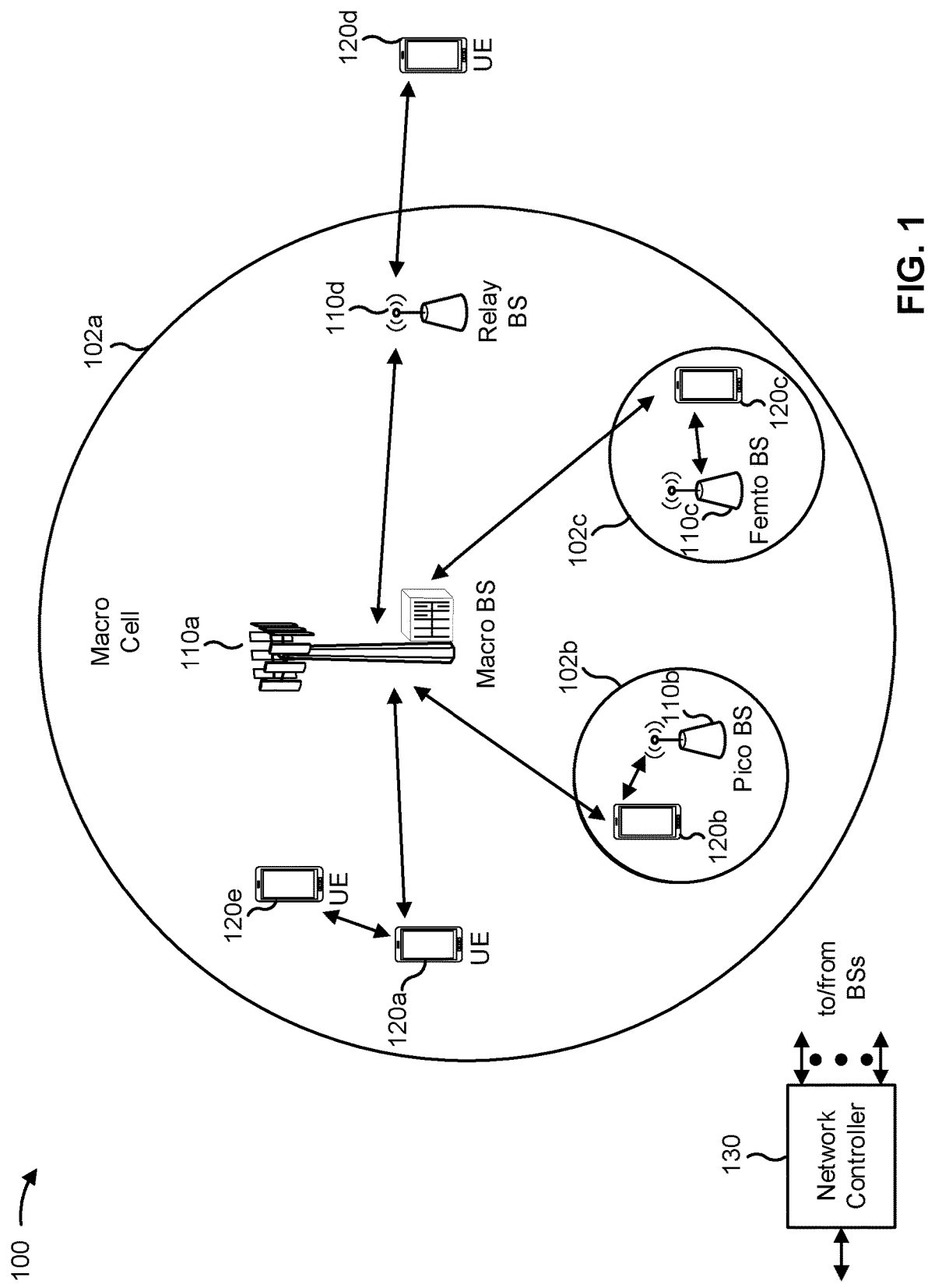
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110a, a BS 110b, a BS 110c, and a BS 110d), a user equipment (UE) 120 or multiple UEs 120 (shown as a UE 120a, a UE 120b, a UE 120c, a UE 120d, and a UE 120e), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may receive one or more indications of parameters associated with one or more downlink communications transmitted to one or more additional UEs; and receive a downlink communication, including applying DPoD correction based at least in part on measurements of the one or more downlink communications transmitted to the one or more additional UEs and the one or more indications of the parameters. Additionally, or alternatively, the communication manager 140 may perform one or more other operations described herein.

In some aspects, the base station 110 may include a communication manager 150. As described in more detail elsewhere herein, the communication manager 150 may transmit, to a UE, one or more indications of parameters associated with one or more downlink communications transmitted to one or more additional UEs; transmit a downlink communication; and receive HARQ-ACK feedback for the downlink communication based at least in part on the UE applying DPoD correction that is based at least in part on measurements of the one or more downlink communications transmitted to the one or more additional UEs and the one or more indications of the parameters. Additionally, or alternatively, the communication manager 150 may perform one or more other operations described herein.

As indicated above, FIG. 1 is provided as an example. Other examples may differ from what is described with regard to FIG. 1.

Figure 2:
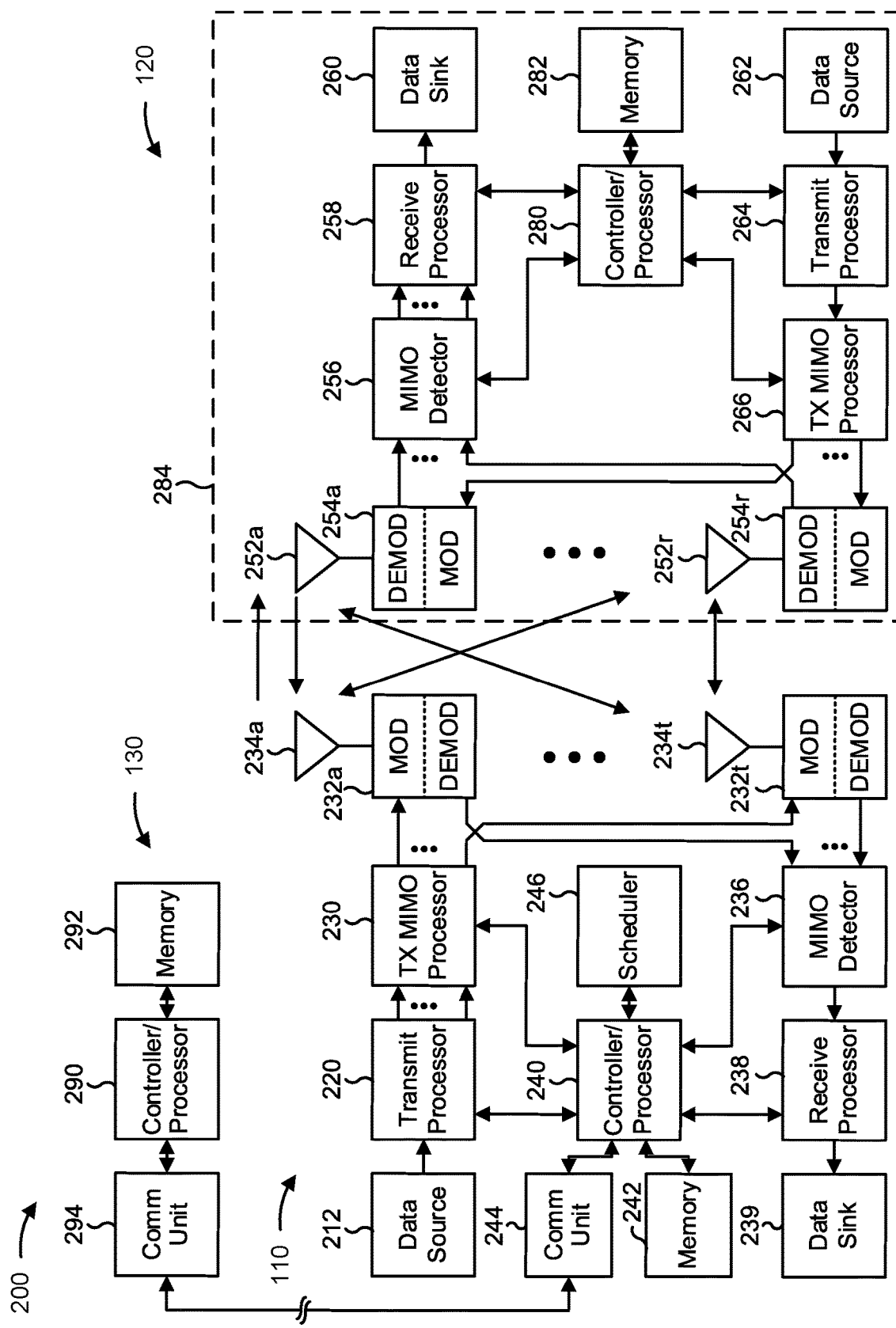
FIG. 2 is a diagram illustrating an example of a base station in communication with a user equipment (UE) in a wireless network, in accordance with the present disclosure.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 4-8).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 4-8).

The controller/processor 240 of the base station 110, the controller/processor 280 of the UE 120, and/or any other component(s) of FIG. 2 may perform one or more techniques associated with multi-user digital post distortion, as described in more detail elsewhere herein. For example, the controller/processor 240 of the base station 110, the controller/processor 280 of the UE 120, and/or any other component(s) of FIG. 2 may perform or direct operations of, for example, process 500 of FIG. 5, process 600 of FIG. 6, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 500 of FIG. 5, process 600 of FIG. 6, and/or other processes as described herein. In some examples, executing instructions may include running the instructions, converting the instructions, compiling the instructions, and/or interpreting the instructions, among other examples.

In some aspects, the UE includes means for receiving one or more indications of parameters associated with one or more downlink communications transmitted to one or more additional UEs; and/or means for receiving a downlink communication, including applying DPoD correction based at least in part on measurements of the one or more downlink communications transmitted to the one or more additional UEs and the one or more indications of the parameters. The means for the UE to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the base station includes means for transmitting, to a UE, one or more indications of parameters associated with one or more downlink communications transmitted to one or more additional UEs; means for transmitting a downlink communication; and/or means for receiving HARQ-ACK feedback for the downlink communication based at least in part on the UE applying DPoD correction that is based at least in part on measurements of the one or more downlink communications transmitted to the one or more additional UEs and the one or more indications of the parameters. The means for the base station to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
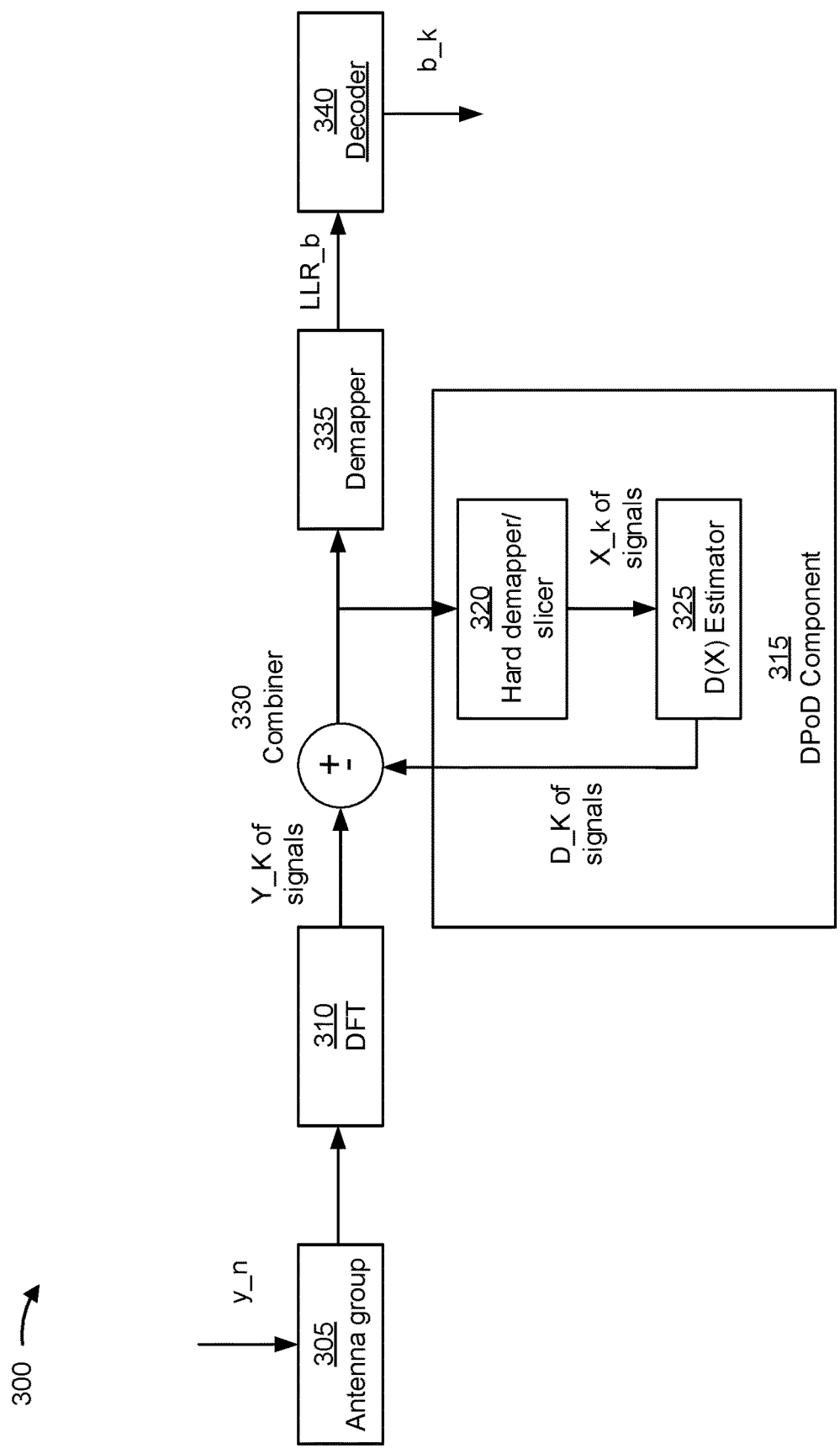
FIG. 3 is a diagram illustrating an example of a digital post distortion process performed by a receiving device, in accordance with the present disclosure

FIG. 3 is a diagram illustrating an example 300 of a digital post distortion process performed by a receiving device, in accordance with the present disclosure. For example, a receiving device (e.g., a UE) may receive a downlink communication, carried on signals, from a transmitting device (e.g., a base station). In some networks, the transmitting device may transmit signals with increasing non-linearity as power amplification increases. For example, a power amplifier (PA) of the transmitting device may distort a signal as a result of a relatively high peak to average power ratio (PAPR). The receiving device may perform a DPoD process to correct for (e.g., estimate and/or remove) non-linear noise and address clipping issues that may arise as a result of the increased non-linearity introduced by power amplification. For example, the receiving device may reconstruct transmission non-linearities and subtract the transmission non-linearities from a received signal (e.g., in an iterative process).

As shown in example 300, an antenna group component 305 may receive one or more signals (e.g., y_n) that are mapped to resources in a time domain and a frequency domain. Discrete Fourier transform (DFT) component 310 may be used to transform the signals into frequency domain signals (e.g., Y_K). After DFT, the receiving device may perform the DPoD process on the frequency domain signals to remove non-linear noise from the signals.

The receiving device may perform the DPoD process iteratively, where in each iteration, a DPoD component 315 may perform hard decision slicing (e.g., using hard demapper/slicer component 320). Hard decision slicing uses sliced symbols in the frequency domain (e.g., Y_K) to reconstruct the time domain signal (e.g., an estimation of the time domain signal) as generated by the transmitting device before power amplification. The reconstructed time domain signal (e.g., X_k) is then passed through a non-linear model (e.g., D(X) estimator component 325) to estimate and or correct for non-linearity of the time domain signal and produce an estimated non-linearity of the time domain signal (e.g., D_K).

The non-linear model may use a variety of kernels to estimate the non-linearity of the reconstructed time domain signal. In each iteration of the DPoD process, a kernel or set of kernels may be used to estimate the non-linearity of the reconstructed time domain signal. For example, memory-less kernels (e.g., kernels that act on samples without using prior iteration/timing data), such as $x^*|x|^2$ and/or $x^*|x|^4$, among other examples, may be used to estimate non-linearity. In some situations (e.g., large bandwidth situations, high signal-to-noise ratio (SNR) situations, among other examples), the non-linear model may use memory kernels (e.g., kernels that use a mixture of different time samples), such as $x[n]^*|x[n-k]|^M$, where x is a sample of the signal, n is a timestamp, k is a delay value, and M is an integer. Other kernels may also be used, such as $x_n^2 \cdot x_{n-1}^*$, and/or $|x_n| \cdot x_{n+1}$, among other examples.

The estimated non-linearity (e.g., D_K) may then be removed (e.g., subtracted) from the time domain signal (e.g., Y_K) by combiner component 330. After estimating and removing non-linearity (e.g., non-linear noise, or error), the DPoD process may proceed with further iterations or continue with signal demapping and decoding. For example, the receiving device may demap output from the combiner component 330 (e.g., using demapper component 335) to generate a log-likelihood ratio (LLR) demapped signal (e.g., LLR_b) that has corrected power amplifier (PA) nonlinearity. A decoder 340 of the receiver may decode the demapped signal to generate a payload of the signal (b_k).

As indicated above, FIG. 3 is provided as an example. Other examples may differ from what is described with respect to FIG. 3.

Based at least in part on the receiving device performing DPoD, the transmitting device may transmit signals using a power amplifier at power levels near a compression point. This may improve power efficiency at the transmitting device, improve capacity of a cell provided by the transmitting device, and/or may support increased transmission power for improved coverage for transmissions from the transmitting device (e.g., an improved signal-to-noise-ratio (SNR)), among other examples. However, when a set of UEs are multiplexed in a frequency domain, a UE may perform a poor estimation of transmission non-linearities (e.g., non-linear noise and/or address clipping) using signals on resources allocated for the UE.

In some aspects described herein, a UE may apply DPoD based at least in part on measurements of signals associated with downlink transmissions to one or more additional UEs. For example, the UE may estimate a transmitted time domain signal of the UE and the one or more additional UEs to reconstruct and subtract the transmission non-linearities from a signal received on resources allocated for a downlink communication to the UE.

In some aspects, the UE may perform (e.g., on signals received on resources allocated to the UE and the one or more additional UEs) channel estimation (e.g., to calculate equalization parameters) and equalization of the signals received on the resources allocated for the downlink communication to the UE. In some aspects, the UE may perform equalization without slicing (e.g., minimum mean squared error (MMSE)-based equalization). The UE may perform equalization without slicing to reduce complexity and limit parameters needed to perform the channel estimation. In this way, the UE may perform equalization without an indication from the base station of MCS, constellation configurations, and/or other information associated with the resources allocated to the one or more additional UEs.

In some aspects, the UE may receive an indication of parameters associated with one or more downlink communications transmitted to the one or more additional UEs. For example, the parameters may include a frequency domain resource assignment (e.g., a frequency domain resource allocation (FDRA)), a time domain resource assignment (e.g., a time domain resource allocation (TDRA)), an indication of one or more antenna ports used to transmit the one or more downlink communications, a DMRS sequence initialization, scrambling identifications of the one or more additional UEs, phase tracking reference signal (PTRS)-related parameters, and/or channel state information reference signals (CSI-RS)-related parameters, among other examples.

In some aspects, the UE may receive the indication of the parameters via downlink control information (DCI). For example, the UE may receive DCI that indicates a frequency domain resource assignment, a time domain resource assignment and/or the one or more antenna ports used to transmit the one or more downlink communications, among other examples.

In some aspects, the base station may indicate radio network temporary identifiers (RNTIs) of the one or more additional UEs having downlink communications that are frequency-division multiplexed with the downlink communication of the UE. The UE may use the RNTIs to monitor DCI messages transmitted to the one or more additional UEs to extract and identify the parameters (e.g., DCI-based parameters) for the downlink communications.

In some aspects, the base station may indicate the parameters using a DCI format (e.g., a new DCI format) that supports the indication of DCI parameters associated with downlink communications transmitted to UEs having downlink communications that are frequency-division multiplexed with the downlink communication of the UE. In some aspects, the base station may indicate the parameters using a common DCI message (e.g., a groupcast DCI message) for multiple UEs (e.g., the UE and the one or more additional UEs) having downlink communications that are frequency-division multiplexed. The common DCI message may indicate parameters for the multiple UEs to perform DPoD using downlink communications transmitted to others of the multiple UEs.

In some aspects, the UE may receive the indication of the parameters using higher layer signaling (e.g., medium access control (MAC) control element (CE) signaling and/or radio resource control (RRC) signaling, among other examples). In some aspects, the parameters received via higher layer signaling may include scrambling identifications of the one or more UEs, PTRS-related parameters, and/or CSI-RS related parameters, among other examples.

In some aspects, the base station may signal the parameters (e.g., higher layer parameters) for candidate UEs (e.g., UEs that may have downlink communications that are frequency-division multiplexed with downlink communications of the UE) in RRC messages. The UE may use the RRC messages to generate a data store of parameters for the candidate UEs. The UE may receive, for a downlink communication and using dynamic signaling (e.g., DCI), an indication of identities (e.g., RNTIs or a hash of the RNTIs, among other examples) the one or more additional UEs having downlink communications that are frequency-division multiplexed with the downlink communication.

In some aspects, the base station may transmit, and the UE may receive, a groupcast message for the candidate UEs to share the parameters. The candidate UEs may be determined by spatial positions (e.g., with UEs sharing a same beam or a beam within a threshold transmission angle from the base station), with the UE performing DPoD correction using parameters and downlink signaling associated with the one or more additional UEs that have downlink communications transmitted in a same set of time domain resources (e.g., simultaneously or in a same slot, among other examples) using the same beam or the beam within the threshold transmission angle from the base station.

Based at least in part on the UE receiving one or more indications (e.g., DCI-based and/or higher-layer-based) of parameters associated with one or more downlink communications transmitted to the one or more additional UEs, the UE may apply DPoD correction to a downlink communication based at least in part on measurements of the one or more downlink communications and the parameters. In this way, the UE and base station may conserve network resources (e.g., based at least in part on communicating using improved spectral efficiency) and/or power resources based at least in part on supporting transmissions using increased PA power levels (e.g., with improved energy efficiency) that may cause distortion. Additionally, or alternatively, the UE may receive the downlink communication with an improved likelihood of decoding the downlink communication based at least in part on the UE using the parameters for the one or more additional UEs to estimate non-linearities of signaling of the downlink communication. In this way, the UE may conserve computing, power, communication, and/or network resources that may otherwise be used to detect and correct communication errors.

Figure 4:
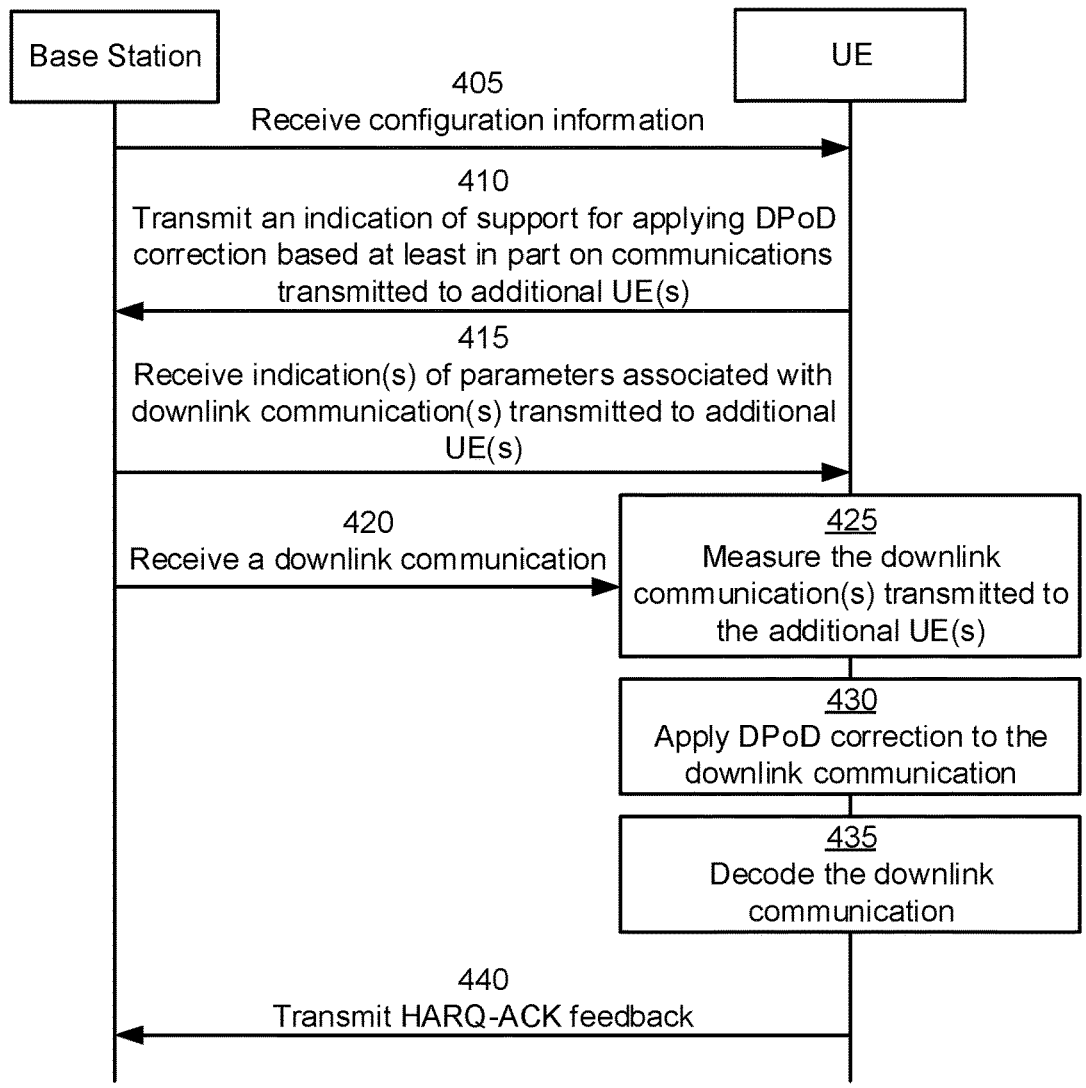
FIG. 4 is a diagram illustrating an example associated with multi-user digital post distortion, in accordance with the present disclosure.

FIG. 4 is a diagram illustrating an example 400 associated with multi-user DPoD, in accordance with the present disclosure. As shown in FIG. 4, a base station (e.g., base station 110) may communicate with a UE (e.g., UE 120). In some aspects, the base station and the UE may be part of a wireless network (e.g., wireless network 100). The UE and the base station may have established a wireless connection prior to operations shown in FIG. 4. One or more additional UEs may also be part of the wireless network. The base station may use frequency-division multiplexing to transmit downlink communications to the UE and the one or more additional UEs. Additionally, or alternatively, the base station may communicate with the UE and the one or more additional UEs using beamforming.

As shown by reference number 405, the base station may transmit, and the UE may receive, configuration information. In some aspects, the UE may receive the configuration information via one or more of RRC signaling, one or more MAC CEs, and/or downlink control information (DCI), among other examples. In some aspects, the configuration information may include an indication of one or more configuration parameters (e.g., already known to the UE) for selection by the UE, or explicit configuration information for the UE to use to configure the UE, among other examples.

In some aspects, the configuration information may indicate that the UE is to apply DPoD correction to downlink communications from the base station. In some aspects, the configuration information may indicate that the UE is to transmit an indication of support for applying DPoD correction based at least in part on communications transmitted to one or more additional UEs. In some aspects, the configuration information may indicate that the base station is to indicate parameters associated with the communications transmitted to the one or more additional UEs, which parameters support the UE applying DPoD correction based at least in part on communications transmitted to one or more additional UEs. In some aspects, the configuration information may indicate how the base station will signal indications of the parameters. For example, the configuration information may indicate that the base station will indicate a first set of parameters via DCI and/or that the base station will indicate a second set of parameters via higher layer signaling (e.g., RRC or MAC CE). Additionally, or alternatively, the configuration information may indicate a type of DCI used to indicate the first set of parameters and/or resources used for the DCI, among other examples.

The UE may configure itself based at least in part on the configuration information. In some aspects, the UE may be configured to perform one or more operations described herein based at least in part on the configuration information.

As shown by reference number 410, the UE may transmit, and the base station may receive, an indication of support for applying DPoD correction based at least in part on communications transmitted to the one or more additional UE (e.g., in a capabilities report). In some aspects, the UE may transmit the indication of support before receiving a portion of the configuration information described in connection with reference number 405. For example, the UE and the base station may exchange a first communication of configuration information, the indication of support, and then a second communication of configuration information that is based at least in part on the indication of support.

As shown by reference number 415, the UE may receive, and the base station may transmit, one or more indications of parameters associated with one or more downlink communications transmitted to the one or more additional UEs. The base station may transmit, and the UE may receive, the one or more indication of parameters using one or more DCI messages, one or more RRC message, and/or one or more MAC CEs. For example, the UE may receive a first set of the one or more indications of parameters via one or more DCI messages, a second set of the one or more indications of parameters via one or more RRC messages, and/or a third set of the one or more indications of parameters via one or more MAC CEs, among other examples.

In some aspects, the parameters may be associated with performing DPoD. For example, the parameters may include an indication of frequency domain resource assignment, an indication of time domain resource assignment, an indication of one or more antenna ports used by the base station to transmit the one or more communications, an indication of DMRS sequence initialization, an indication of scrambling identifications, an indication of phase tracking reference signal parameters, and/or an indication of CSI-RS parameters, among other examples.

In some aspects, the UE may receive the first set of the one or more indications via a DCI based at least in part on receiving an indication of RNTIs associated with the one or more UEs (e.g., associated with the scrambling identifications). The UE may use the RNTIs to receive (e.g., and descramble) DCI messages transmitted to the one or more additional UEs. The UE may identity, within the DCI messages transmitted to the one or more additional UEs, the first set of the one or more indications.

In some aspects, the UE may receive the first set of the one or more indications via a DCI message, addressed to the UE, that indicates the first set of one or more indications of parameters. Additionally, or alternatively, the UE may receive the first set of the one or more indications via a common DCI message, addressed to the UE and the one or more additional UEs, that indicates the first set of one or more indications of parameters. In this way, each of the UE and the one or more additional UEs may have the parameters needed to perform DPoD correction using downlink communications transmitted to other UEs.

In some aspects, the UE may receive a set of the one or more indications via RRC signaling, one or more MAC CEs, and/or one or more groupcast messages addressed to the UE and the one or more additional UEs (e.g., indicating the set of the one or more indications of parameters that are associated with a set of candidate additional UEs). The set of the one or more indications of parameters may include parameters that are associated with the set of candidate additional UEs that includes the one or more additional UEs. The UE may store (e.g., as a database or a table, among other examples) the parameters with different identifiers (e.g., a bitmap-based indication, RNTIs, hashes of the RNTIs, and/or scrambling identifications, among other examples).

The UE may receive, for the downlink communication, dynamic signaling (e.g., a DCI message and/or a MAC CE, among other examples) that indicates selection of the one or more additional UEs from the set of candidate additional UEs. The indication of the selection may include an indication of RNTIs, hashes of the RNTIs, and/or scrambling identifications, among other examples. The base station may transmit the dynamic signaling to indicate the selection of the one or more UEs based at least in part on the one or more UEs having downlink communications that are multiplexed in the frequency domain with the downlink communication and/or the one or more downlink communications scheduled for transmission on a same beam as the downlink communication or on a downlink beam that is within a threshold transmission angle from the base station, among other examples.

As shown by reference number 420, the UE may receive, and the base station may transmit a downlink communication. For example, the UE may receive the downlink communication via a physical downlink shared channel (PDSCH) that is multiplexed in a frequency domain (e.g., during a same or overlapping set of time resources) with one or more additional PDSCHs that are associated with the one or more additional UEs.

As shown by reference number 425, the UE may measure the one or more downlink communications transmitted to the one or more additional UEs. In some aspects, the UE may measure the one or more downlink communications during reception of the downlink communication. For example, the UE may measure the one or more downlink communications and the downlink communications using communication resources that overlap (e.g., partially or entirely) in time (e.g., the one or more downlink communications and the downlink communication may be frequency division multiplexed by the base station).

In some aspects, the base station may transmit the one or more downlink communications and the downlink communication via a same downlink beam. In some aspects, the base station may transmit a set (e.g., all or a subset) of the one or more downlink communications be a downlink beam that is within a threshold transmission angle from the base station.

As shown by reference number 430, the UE may apply DPoD correction to the downlink communication. For example, the UE may apply DPoD correction based at least in part on measurements of the one or more downlink communications transmitted to the one or more additional UEs and the one or more indications of the parameters.

In some aspects, the UE may apply the DPoD correction based at least in part on estimating a channel that includes allocations for the one or more downlink communications and the downlink communication. The UE may estimate constellation points of signals associated with the channel (e.g., using the one or more downlink communications and/or an estimate of the channel). The UE may equalize the signals based at least in part on the estimate of the channel and/or the estimate of the constellation points of the signals. Based at least in part on equalizing the signals, the UE may estimate non-linearities of the signals and correct for the non-linearities of a portion of the signals that are associated with the downlink communication.

As shown by reference number 435, the UE may decode the downlink communication. The UE may decode the downlink communication based at least in part on applying the DPoD correction to the downlink communication.

As shown by reference number 440, the UE may transmit HARQ-ACK feedback based at least in part on the downlink communication. In some aspects, the HARQ-ACK feedback may have an improved likelihood of being an ACK based at least in part on the UE applying DPoD correction that is based at least in part on measurements of the one or more downlink communications transmitted to the one or more additional UEs and the one or more indications of the parameters.

Based at least in part on the UE receiving the one or more indications (e.g., DCI-based and/or higher-layer-based) of parameters associated with one or more downlink communications transmitted to the one or more additional UEs, the UE may apply DPoD correction to a downlink communication based at least in part on measurements of the one or more downlink communications and the parameters. In this way, the UE and base station may conserve network resources (e.g., based at least in part on communicating using improved spectral efficiency) and/or power resources based at least in part on supporting transmissions using increased PA power levels (e.g., with improved energy efficiency) that may cause distortion. Additionally, or alternatively, the UE may receive the downlink communication with an improved likelihood of decoding the downlink communication based at least in part on the UE using the parameters for the one or more additional UEs to estimate non-linearities of signaling of the downlink communication. In this way, the UE may conserve computing, power, communication, and/or network resources that may otherwise be used to detect and correct communication errors.

As indicated above, FIG. 4 is provided as an example. Other examples may differ from what is described with respect to FIG. 4.

Figure 5:
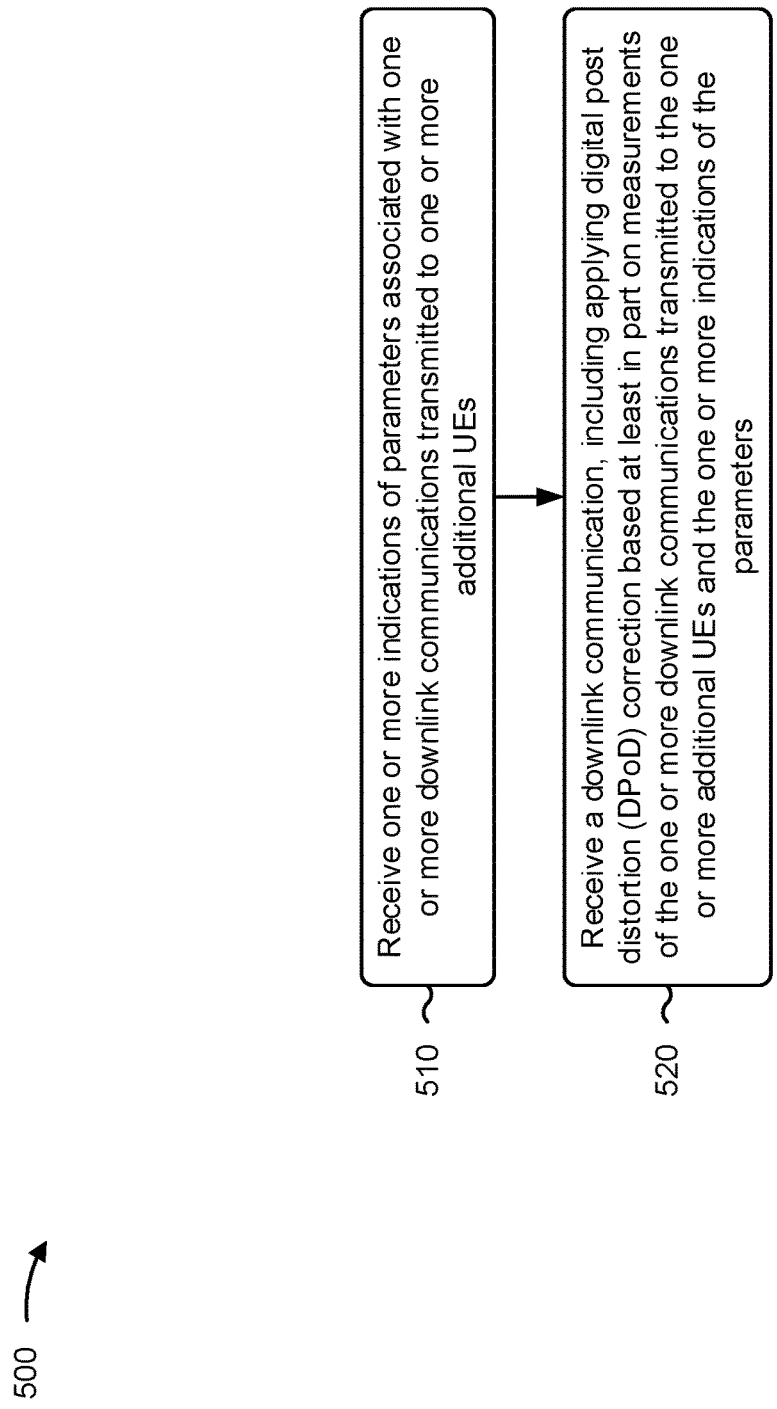
FIGS. 5 and 6 are diagrams illustrating example processes associated with multi-user digital post distortion, in accordance with the present disclosure.

FIG. 5 is a diagram illustrating an example process 500 performed, for example, by a UE, in accordance with the present disclosure. Example process 500 is an example where the UE (e.g., UE 120) performs operations associated with multi-user DPoD.

As shown in FIG. 5, in some aspects, process 500 may include receiving one or more indications of parameters associated with one or more downlink communications transmitted to one or more additional UEs (block 510). For example, the UE (e.g., using communication manager 140 and/or reception component 702, depicted in FIG. 7) may receive one or more indications of parameters associated with one or more downlink communications transmitted to one or more additional UEs, as described above.

As further shown in FIG. 5, in some aspects, process 500 may include receiving a downlink communication, including applying DPoD correction based at least in part on measurements of the one or more downlink communications transmitted to the one or more additional UEs and the one or more indications of the parameters (block 520). For example, the UE (e.g., using communication manager 140 and/or reception component 702, depicted in FIG. 7) may receive a downlink communication, including applying DPoD correction based at least in part on measurements of the one or more downlink communications transmitted to the one or more additional UEs and the one or more indications of the parameters, as described above.

Process 500 may include additional aspects, such as any single aspect or any combination of aspects described below and/or in connection with one or more other processes described elsewhere herein.

In a first aspect, the one or more downlink communications and the downlink communication are frequency division multiplexed by a transmitting device.

In a second aspect, alone or in combination with the first aspect, the one or more downlink communications and the downlink communication are transmitted via a same downlink beam from a transmitting device, or wherein the one or more downlink communications are transmitted via a first downlink beam and the downlink communication are transmitted via a second downlink beam that is within a threshold transmission angle from the transmitting device.

In a third aspect, alone or in combination with one or more of the first and second aspects, applying the DPoD correction comprises one or more of estimating a channel that includes allocations for the one or more downlink communications and the downlink communication, estimating constellation points of signals associated with the channel equalizing the signals, estimating non-linearities of the signals, or correcting for the non-linearities of a portion of the signals that are associated with the downlink communication.

In a fourth aspect, alone or in combination with one or more of the first through third aspects, the one or more indications of parameters comprise one or more of an indication of frequency domain resource assignment, an indication of time domain resource assignment, an indication of one or more antenna ports, an indication of DMRS sequence initialization, an indication of scrambling identifications, an indication of phase tracking reference signal parameters, or an indication of CSI-RS parameters.

In a fifth aspect, alone or in combination with one or more of the first through fourth aspects, receiving the one or more indications of parameters comprises one or more of receiving a first set of the one or more indications of parameters via one or more DCI messages, receiving a second set of the one or more indications of parameters via one or more RRC messages, or receiving a third set of the one or more indications of parameters via one or more MAC CEs.

In a sixth aspect, alone or in combination with one or more of the first through fifth aspects, receiving the first set of the one or more indications of parameters via one or more DCI messages comprises receiving one or more RNTIs associated with the one or more additional UEs, receiving the one or more DCI messages that are associated with the one or more additional UEs, or identifying the one or more indications of the first set of the one or more indications of parameters associated with one or more downlink communications transmitted to the one or more additional UEs.

In a seventh aspect, alone or in combination with one or more of the first through sixth aspects, receiving the first set of the one or more indications of parameters via one or more DCI messages comprises one or more of receiving a DCI message, addressed to the UE, that indicates the first set of one or more indications of parameters, or receiving a common DCI message, addressed to the UE and the one or more additional UEs, that indicates the first set of one or more indications of parameters.

In an eighth aspect, alone or in combination with one or more of the first through seventh aspects, receiving the one or more indications of parameters comprises one or more of receiving, via RRC signaling or a MAC CE, a set of the one or more indications of parameters that are associated with a set of candidate additional UEs that includes the one or more additional UEs, or receiving, via dynamic signaling, an indication of selection of the one or more additional UEs from the set of candidate additional UEs.

In a ninth aspect, alone or in combination with one or more of the first through eighth aspects, the indication of the selection of the one or more additional UEs includes an indication of RNTIs of the one or more additional UEs or an indication of a hash of the RNTIs of the one or more additional UEs.

In a tenth aspect, alone or in combination with one or more of the first through ninth aspects, receiving the set of the one or more indications of parameters that are associated with the set of candidate additional UEs comprises receiving a groupcast message, addressed to the UE and the one or more additional UEs, that indicates the set of the one or more indications of parameters that are associated with the set of candidate additional UEs.

In an eleventh aspect, alone or in combination with one or more of the first through tenth aspects, the set of candidate additional UEs are associated with a same downlink beam, or wherein the set of candidate additional UEs are associated with downlink beams within a threshold transmission angle from a transmitting device.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

Figure 6:
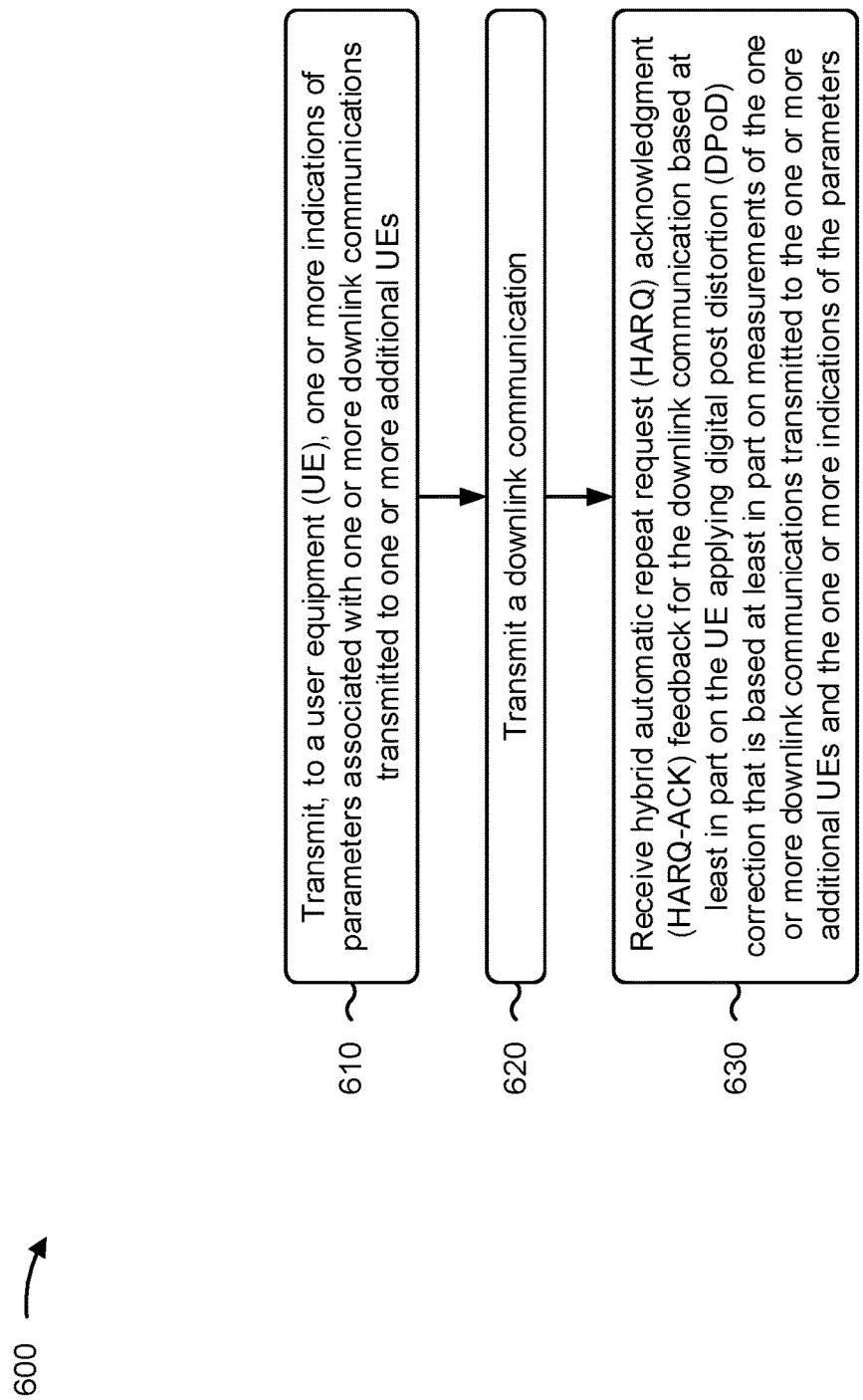

FIG. 6 is a diagram illustrating an example process 600 performed, for example, by a base station, in accordance with the present disclosure. Example process 600 is an example where the base station (e.g., base station 110) performs operations associated with multi-user DPoD.

As shown in FIG. 6, in some aspects, process 600 may include transmitting, to a UE, one or more indications of parameters associated with one or more downlink communications transmitted to one or more additional UEs (block 610). For example, the base station (e.g., using communication manager 150 and/or transmission component 704, depicted in FIG. 7) may transmit, to a UE, one or more indications of parameters associated with one or more downlink communications transmitted to one or more additional UEs, as described above.

As further shown in FIG. 6, in some aspects, process 600 may include transmitting a downlink communication (block 620). For example, the base station (e.g., using communication manager 150 and/or transmission component 704, depicted in FIG. 7) may transmit a downlink communication, as described above.

As further shown in FIG. 6, in some aspects, process 600 may include receiving HARQ-ACK feedback for the downlink communication based at least in part on the UE applying DPoD correction that is based at least in part on measurements of the one or more downlink communications transmitted to the one or more additional UEs and the one or more indications of the parameters (block 630). For example, the base station (e.g., using communication manager 150 and/or reception component 702, depicted in FIG. 7) may receive HARQ-ACK feedback for the downlink communication based at least in part on the UE applying DPoD correction that is based at least in part on measurements of the one or more downlink communications transmitted to the one or more additional UEs and the one or more indications of the parameters, as described above.

Process 600 may include additional aspects, such as any single aspect or any combination of aspects described below and/or in connection with one or more other processes described elsewhere herein.

In a first aspect, the one or more downlink communications and the downlink communication are frequency division multiplexed by a transmitting device.

In a second aspect, alone or in combination with the first aspect, the one or more downlink communications and the downlink communication are transmitted via a same downlink beam, or wherein the one or more downlink communications are transmitted via a first downlink beam and the downlink communication are transmitted via a second downlink beam that is within a threshold transmission angle from the base station.

In a third aspect, alone or in combination with one or more of the first and second aspects, the one or more indications of parameters comprise one or more of an indication of frequency domain resource assignment, an indication of time domain resource assignment, an indication of one or more antenna ports, an indication of DMRS sequence initialization, an indication of scrambling identifications, an indication of phase tracking reference signal parameters, or an indication of CSI-RS parameters.

In a fourth aspect, alone or in combination with one or more of the first through third aspects, transmitting the one or more indications of parameters comprises one or more of transmitting a first set of the one or more indications of parameters via one or more DCI messages, transmitting a second set of the one or more indications of parameters via one or more RRC messages, or transmitting a third set of the one or more indications of parameters via one or more MAC CEs.

In a fifth aspect, alone or in combination with one or more of the first through fourth aspects, transmitting the first set of the one or more indications of parameters via one or more DCI messages comprises transmitting one or more RNTIs associated with the one or more additional UEs, or transmitting the one or more DCI messages that are associated with the one or more additional UEs.

In a sixth aspect, alone or in combination with one or more of the first through fifth aspects, transmitting the first set of the one or more indications of parameters via one or more DCI messages comprises one or more of transmitting a DCI message, addressed to the UE, that indicates the first set of one or more indications of parameters, or transmitting a common DCI message, addressed to the UE and the one or more additional UEs, that indicates the first set of one or more indications of parameters.

In a seventh aspect, alone or in combination with one or more of the first through sixth aspects, transmitting the one or more indications of parameters comprises one or more of transmitting, via RRC signaling or a MAC CE, a set of the one or more indications of parameters that are associated with a set of candidate additional UEs that includes the one or more additional UEs, or transmitting, via dynamic signaling, an indication of selection of the one or more additional UEs from the set of candidate additional UEs.

In an eighth aspect, alone or in combination with one or more of the first through seventh aspects, the indication of the selection of the one or more additional UEs includes an indication of RNTIs of the one or more additional UEs or an indication of a hash of the RNTIs of the one or more additional UEs.

In a ninth aspect, alone or in combination with one or more of the first through eighth aspects, transmitting the set of the one or more indications of parameters that are associated with the set of candidate additional UEs comprises transmitting a groupcast message, addressed to the UE and the one or more additional UEs, that indicates the set of the one or more indications of parameters that are associated with the set of candidate additional UEs.

In a tenth aspect, alone or in combination with one or more of the first through ninth aspects, the set of candidate additional UEs are associated with a same downlink beam, or wherein the set of candidate additional UEs are associated with downlink beams within a threshold transmission angle.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
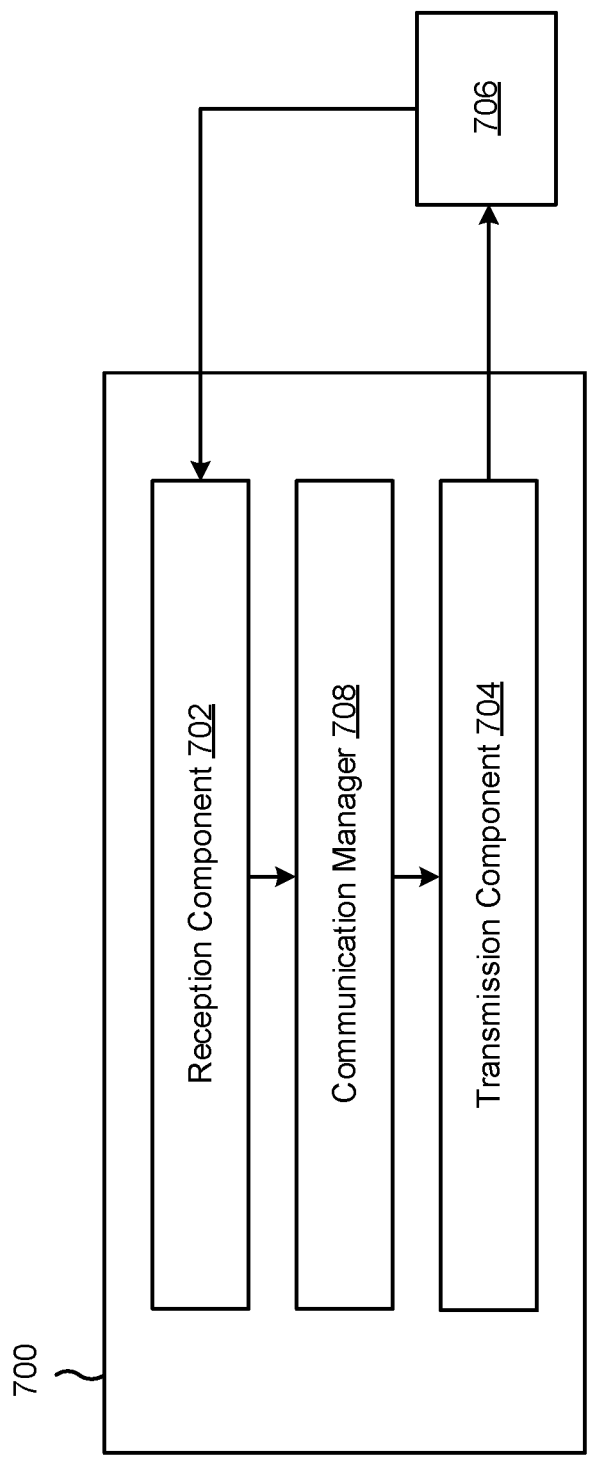
FIGS. 7 and 8 are diagrams of example apparatuses for wireless communication, in accordance with the present disclosure.

FIG. 7 is a diagram of an example apparatus 700 for wireless communication. The apparatus 700 may be a UE, or a UE may include the apparatus 700. In some aspects, the apparatus 700 includes a reception component 702 and a transmission component 704, which may be in communication with one another (for example, via one or more buses and/or one or more other components). As shown, the apparatus 700 may communicate with another apparatus 706 (such as a UE, a base station, or another wireless communication device) using the reception component 702 and the transmission component 704. As further shown, the apparatus 700 may include a communication manager 708 (e.g., the communication manager 140).

In some aspects, the apparatus 700 may be configured to perform one or more operations described herein in connection with FIG. 4. Additionally, or alternatively, the apparatus 700 may be configured to perform one or more processes described herein, such as process 500 of FIG. 5. In some aspects, the apparatus 700 and/or one or more components shown in FIG. 7 may include one or more components of the UE described in connection with FIG. 2. Additionally, or alternatively, one or more components shown in FIG. 7 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 702 may receive communications, such as reference signals, control information, data communications, or a combination thereof, from the apparatus 706. The reception component 702 may provide received communications to one or more other components of the apparatus 700. In some aspects, the reception component 702 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 700. In some aspects, the reception component 702 may include one or more antennas, a modem, a demodulator, a MIMO detector, a receive processor, a controller/processor, a memory, or a combination thereof, of the UE described in connection with FIG. 2.

The transmission component 704 may transmit communications, such as reference signals, control information, data communications, or a combination thereof, to the apparatus 706. In some aspects, one or more other components of the apparatus 700 may generate communications and may provide the generated communications to the transmission component 704 for transmission to the apparatus 706. In some aspects, the transmission component 704 may perform signal processing on the generated communications (such as filtering, amplification, modulation, digital-to-analog conversion, multiplexing, interleaving, mapping, or encoding, among other examples), and may transmit the processed signals to the apparatus 706. In some aspects, the transmission component 704 may include one or more antennas, a modem, a modulator, a transmit MIMO processor, a transmit processor, a controller/processor, a memory, or a combination thereof, of the UE described in connection with FIG. 2. In some aspects, the transmission component 704 may be co-located with the reception component 702 in a transceiver.

The reception component 702 may receive one or more indications of parameters associated with one or more downlink communications transmitted to one or more additional UEs. The reception component 702 may receive a downlink communication, including applying DPoD correction based at least in part on measurements of the one or more downlink communications transmitted to the one or more additional UEs and the one or more indications of the parameters.

The number and arrangement of components shown in FIG. 7 are provided as an example. In practice, there may be additional components, fewer components, different components, or differently arranged components than those shown in FIG. 7. Furthermore, two or more components shown in FIG. 7 may be implemented within a single component, or a single component shown in FIG. 7 may be implemented as multiple, distributed components. Additionally, or alternatively, a set of (one or more) components shown in FIG. 7 may perform one or more functions described as being performed by another set of components shown in FIG. 7.

Figure 8:
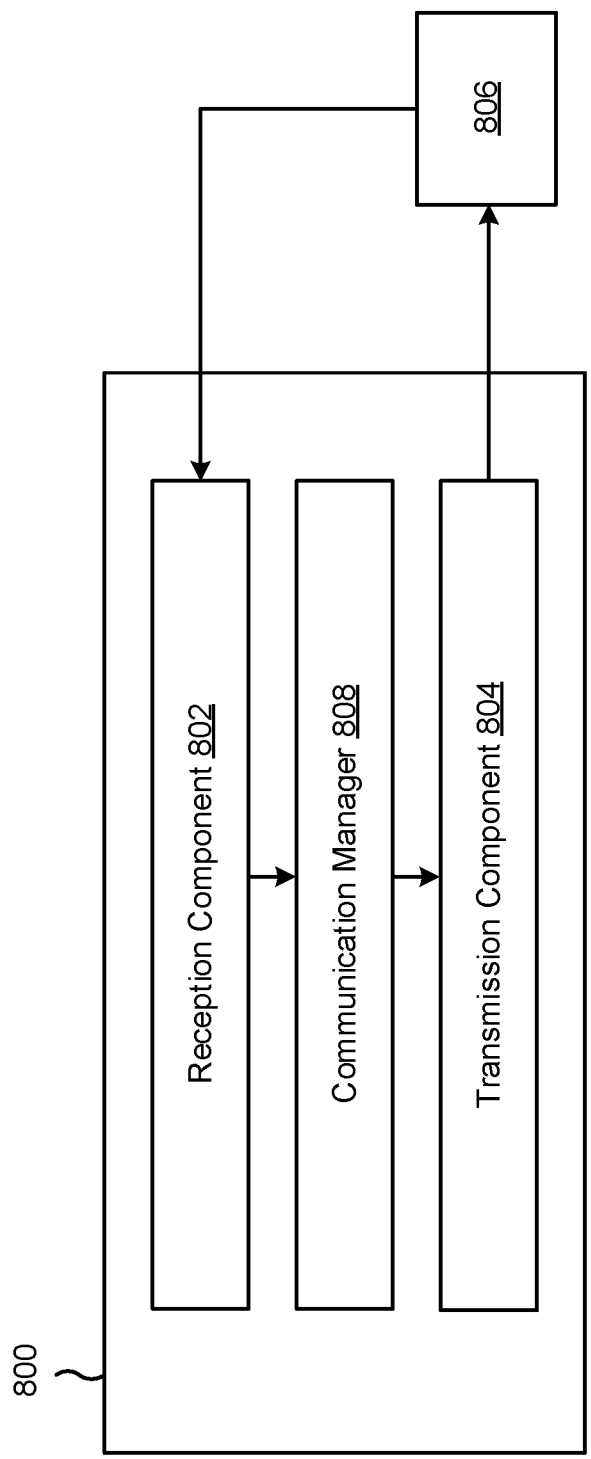

FIG. 8 is a diagram of an example apparatus 800 for wireless communication. The apparatus 800 may be a base station, or a base station may include the apparatus 800. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include a communication manager 808 (e.g., the communication manager 150).

In some aspects, the apparatus 800 may be configured to perform one or more operations described herein in connection with FIG. 4. Additionally, or alternatively, the apparatus 800 may be configured to perform one or more processes described herein, such as process 600 of FIG. 6. In some aspects, the apparatus 800 and/or one or more components shown in FIG. 8 may include one or more components of the base station described in connection with FIG. 2. Additionally, or alternatively, one or more components shown in FIG. 8 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 800. In some aspects, the reception component 802 may include one or more antennas, a modem, a demodulator, a MIMO detector, a receive processor, a controller/processor, a memory, or a combination thereof, of the base station described in connection with FIG. 2.

The transmission component 804 may transmit communications, such as reference signals, control information, data communications, or a combination thereof, to the apparatus 806. In some aspects, one or more other components of the apparatus 800 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modem, a modulator, a transmit MIMO processor, a transmit processor, a controller/processor, a memory, or a combination thereof, of the base station described in connection with FIG. 2. In some aspects, the transmission component 804 may be co-located with the reception component 802 in a transceiver.

The transmission component 804 may transmit, to a UE, one or more indications of parameters associated with one or more downlink communications transmitted to one or more additional UEs. The transmission component 804 may transmit a downlink communication. The reception component 802 may receive HARQ-ACK feedback for the downlink communication based at least in part on the UE applying DPoD correction that is based at least in part on measurements of the one or more downlink communications transmitted to the one or more additional UEs and the one or more indications of the parameters.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

The following provides an overview of some Aspects of the present disclosure:

Aspect 1: A method of wireless communication performed by a user equipment (UE), comprising: receiving one or more indications of parameters associated with one or more downlink communications transmitted to one or more additional UEs; and receiving a downlink communication, including applying digital post distortion (DPoD) correction based at least in part on measurements of the one or more downlink communications transmitted to the one or more additional UEs and the one or more indications of the parameters.

Aspect 2: The method of Aspect 1, wherein the one or more downlink communications and the downlink communication are frequency division multiplexed by a transmitting device.

Aspect 3: The method of any of Aspects 1-2, wherein the one or more downlink communications and the downlink communication are transmitted via a same downlink beam from a transmitting device, or wherein the one or more downlink communications are transmitted via a first downlink beam and the downlink communication are transmitted via a second downlink beam that is within a threshold transmission angle from the transmitting device.

Aspect 4: The method of any of Aspects 1-3, wherein applying the DPoD correction comprises one or more of: estimating a channel that includes allocations for the one or more downlink communications and the downlink communication, estimating constellation points of signals associated with the channel equalizing the signals, estimating non-linearities of the signals, or correcting for the non-linearities of a portion of the signals that are associated with the downlink communication.

Aspect 5: The method of any of Aspects 1-4, wherein the one or more indications of parameters comprise one or more of: an indication of frequency domain resource assignment, an indication of time domain resource assignment, an indication of one or more antenna ports, an indication of demodulation reference signal (DMRS) sequence initialization, an indication of scrambling identifications, an indication of phase tracking reference signal parameters, or an indication of channel state information reference signals (CSI-RS) parameters.

Aspect 6: The method of any of Aspects 1-5, wherein receiving the one or more indications of parameters comprises one or more of: receiving a first set of the one or more indications of parameters via one or more downlink control information (DCI) messages, receiving a second set of the one or more indications of parameters via one or more radio resource control (RRC) messages, or receiving a third set of the one or more indications of parameters via one or more medium access control (MAC) control elements (CEs).

Aspect 7: The method of Aspect 6, wherein receiving the first set of the one or more indications of parameters via one or more downlink control information (DCI) messages comprises: receiving one or more radio network temporary identifiers (RNTIs) associated with the one or more additional UEs; receiving the one or more DCI messages that are associated with the one or more additional UEs; or identifying the one or more indications of the first set of the one or more indications of parameters associated with one or more downlink communications transmitted to the one or more additional UEs.

Aspect 8: The method of Aspect 6, wherein receiving the first set of the one or more indications of parameters via one or more downlink control information (DCI) messages comprises one or more of: receiving a DCI message, addressed to the UE, that indicates the first set of one or more indications of parameters, or receiving a common DCI message, addressed to the UE and the one or more additional UEs, that indicates the first set of one or more indications of parameters.

Aspect 9: The method of any of Aspects 1-8, wherein receiving the one or more indications of parameters comprises one or more of: receiving, via radio resource control (RRC) signaling or a medium access control (MAC) control element (CE), a set of the one or more indications of parameters that are associated with a set of candidate additional UEs that includes the one or more additional UEs; or receiving, via dynamic signaling, an indication of selection of the one or more additional UEs from the set of candidate additional UEs.

Aspect 10: The method of Aspect 9, wherein the indication of the selection of the one or more additional UEs includes an indication of radio network temporary identifiers (RNTIs) of the one or more additional UEs or an indication of a hash of the RNTIs of the one or more additional UEs.

Aspect 11: The method of any of Aspects 9-10, wherein receiving the set of the one or more indications of parameters that are associated with the set of candidate additional UEs comprises: receiving a groupcast message, addressed to the UE and the one or more additional UEs, that indicates the set of the one or more indications of parameters that are associated with the set of candidate additional UEs.

Aspect 12: The method of any of Aspects 9-11, wherein the set of candidate additional UEs are associated with a same downlink beam, or wherein the set of candidate additional UEs are associated with downlink beams within a threshold transmission angle from a transmitting device.

Aspect 13: A method of wireless communication performed by a base station, comprising: transmitting, to a user equipment (UE), one or more indications of parameters associated with one or more downlink communications transmitted to one or more additional UEs; transmitting a downlink communication; and receiving hybrid automatic repeat request (HARD) acknowledgment (HARQ-ACK) feedback for the downlink communication based at least in part on the UE applying digital post distortion (DPoD) correction that is based at least in part on measurements of the one or more downlink communications transmitted to the one or more additional UEs and the one or more indications of the parameters.

Aspect 14: The method of Aspect 13, wherein the one or more downlink communications and the downlink communication are frequency division multiplexed by a transmitting device.

Aspect 15: The method of any of Aspects 13-14, wherein the one or more downlink communications and the downlink communication are transmitted via a same downlink beam, or wherein the one or more downlink communications are transmitted via a first downlink beam and the downlink communication are transmitted via a second downlink beam that is within a threshold transmission angle from the base station.

Aspect 16: The method of any of Aspects 13-15, wherein the one or more indications of parameters comprise one or more of: an indication of frequency domain resource assignment, an indication of time domain resource assignment, an indication of one or more antenna ports, an indication of demodulation reference signal (DMRS) sequence initialization, an indication of scrambling identifications, an indication of phase tracking reference signal parameters, or an indication of channel state information reference signals (CSI-RS) parameters.

Aspect 17: The method of any of Aspects 13-16, wherein transmitting the one or more indications of parameters comprises one or more of: transmitting a first set of the one or more indications of parameters via one or more downlink control information (DCI) messages, transmitting a second set of the one or more indications of parameters via one or more radio resource control (RRC) messages, or transmitting a third set of the one or more indications of parameters via one or more medium access control (MAC) control elements (CEs).

Aspect 18: The method of Aspect 17, wherein transmitting the first set of the one or more indications of parameters via one or more downlink control information (DCI) messages comprises: transmitting one or more radio network temporary identifiers (RNTIs) associated with the one or more additional UEs; or transmitting the one or more DCI messages that are associated with the one or more additional UEs.

Aspect 19: The method of Aspect 17, wherein transmitting the first set of the one or more indications of parameters via one or more downlink control information (DCI) messages comprises one or more of: transmitting a DCI message, addressed to the UE, that indicates the first set of one or more indications of parameters, or transmitting a common DCI message, addressed to the UE and the one or more additional UEs, that indicates the first set of one or more indications of parameters.

Aspect 20: The method of any of Aspects 13-19, wherein transmitting the one or more indications of parameters comprises one or more of: transmitting, via radio resource control (RRC) signaling or a medium access control (MAC) control element (CE), a set of the one or more indications of parameters that are associated with a set of candidate additional UEs that includes the one or more additional UEs; or transmitting, via dynamic signaling, an indication of selection of the one or more additional UEs from the set of candidate additional UEs.

Aspect 21: The method of Aspect 20, wherein the indication of the selection of the one or more additional UEs includes an indication of radio network temporary identifiers (RNTIs) of the one or more additional UEs or an indication of a hash of the RNTIs of the one or more additional UEs.

Aspect 22: The method of Aspect 21, wherein transmitting the set of the one or more indications of parameters that are associated with the set of candidate additional UEs comprises: transmitting a groupcast message, addressed to the UE and the one or more additional UEs, that indicates the set of the one or more indications of parameters that are associated with the set of candidate additional UEs.

Aspect 23: The method of any of Aspects 21-22, wherein the set of candidate additional UEs are associated with a same downlink beam, or wherein the set of candidate additional UEs are associated with downlink beams within a threshold transmission angle.

Aspect 24: An apparatus for wireless communication at a device, comprising a processor; memory coupled with the processor; and instructions stored in the memory and executable by the processor to cause the apparatus to perform the method of one or more of Aspects 1-23.

Aspect 25: A device for wireless communication, comprising a memory and one or more processors coupled to the memory, the one or more processors configured to perform the method of one or more of Aspects 1-23.

Aspect 26: An apparatus for wireless communication, comprising at least one means for performing the method of one or more of Aspects 1-23.

Aspect 27: A non-transitory computer-readable medium storing code for wireless communication, the code comprising instructions executable by a processor to perform the method of one or more of Aspects 1-23.

Aspect 28: A non-transitory computer-readable medium storing a set of instructions for wireless communication, the set of instructions comprising one or more instructions that, when executed by one or more processors of a device, cause the device to perform the method of one or more of Aspects 1-23.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A user equipment (UE) for wireless communication, comprising:
   a memory; and
   one or more processors, coupled to the memory, configured to:
      receive one or more indications of parameters associated with one or more downlink communications transmitted to one or more additional UEs; and
      receive a downlink communication, including applying digital post distortion (DPoD) correction based at least in part on measurements of the one or more downlink communications transmitted to the one or more additional UEs and the one or more indications of the parameters.

2. The UE of claim 1, wherein the one or more downlink communications and the downlink communication are frequency division multiplexed by a transmitting device.

3. The UE of claim 1, wherein the one or more downlink communications and the downlink communication are transmitted via a same downlink beam from a transmitting device, or
   wherein the one or more downlink communications are transmitted via a first downlink beam and the downlink communication are transmitted via a second downlink beam that is within a threshold transmission angle from the transmitting device.

4. The UE of claim 1, wherein the one or more processors, to apply the DPoD correction, are configured to:
   estimate a channel that includes allocations for the one or more downlink communications and the downlink communication,
   estimate constellation points of signals associated with the channel,
   equalize the signals,
   estimate non-linearities of the signals, or
   correct for the non-linearities of a portion of the signals that are associated with the downlink communication.

5. The UE of claim 1, wherein the one or more indications of parameters comprise one or more of:
   an indication of frequency domain resource assignment,
   an indication of time domain resource assignment,
   an indication of one or more antenna ports,
   an indication of demodulation reference signal (DMRS) sequence initialization,
   an indication of scrambling identifications,
   an indication of phase tracking reference signal parameters, or an indication of channel state information reference signals (CSI-RS) parameters.

6. The UE of claim 1, wherein the one or more processors, to receive the one or more indications of parameters, are configured to:
receive a first set of the one or more indications of parameters via one or more downlink control information (DCI) messages,
receive a second set of the one or more indications of parameters via one or more radio resource control (RRC) messages, or
receive a third set of the one or more indications of parameters via one or more medium access control (MAC) control elements (CEs).

7. The UE of claim 6, wherein the one or more processors, to receive the first set of the one or more indications of parameters via one or more downlink control information (DCI) messages, are configured to:
receive one or more radio network temporary identifiers (RNTIs) associated with the one or more additional UEs;
receive the one or more DCI messages that are associated with the one or more additional UEs; or
identify the one or more indications of the first set of the one or more indications of parameters associated with one or more downlink communications transmitted to the one or more additional UEs.

8. The UE of claim 6, wherein the one or more processors, to receive the first set of the one or more indications of parameters via one or more downlink control information (DCI) messages, are configured to:
receive a DCI message, addressed to the UE, that indicates the first set of one or more indications of parameters, or
receive a common DCI message, addressed to the UE and the one or more additional UEs, that indicates the first set of one or more indications of parameters.

9. The UE of claim 1, wherein the one or more processors, to receive the one or more indications of parameters, are configured to:
receive, via radio resource control (RRC) signaling or a medium access control (MAC) control element (CE), a set of the one or more indications of parameters that are associated with a set of candidate additional UEs that includes the one or more additional UEs; or
receive, via dynamic signaling, an indication of selection of the one or more additional UEs from the set of candidate additional UEs.

10. The UE of claim 9, wherein the indication of the selection of the one or more additional UEs includes an indication of radio network temporary identifiers (RNTIs) of the one or more additional UEs or an indication of a hash of the RNTIs of the one or more additional UEs.

11. The UE of claim 9, wherein the one or more processors, to receive the set of the one or more indications of parameters that are associated with the set of candidate additional UEs, are configured to:
receive a groupcast message, addressed to the UE and the one or more additional UEs, that indicates the set of the one or more indications of parameters that are associated with the set of candidate additional UEs.

12. The UE of claim 9, wherein the set of candidate additional UEs are associated with a same downlink beam, or
wherein the set of candidate additional UEs are associated with downlink beams within a threshold transmission angle from a transmitting device.

13. A network entity for wireless communication, comprising:
a memory; and
one or more processors, coupled to the memory, configured to:
transmit, to a user equipment (UE), one or more indications of parameters associated with one or more downlink communications transmitted to one or more additional UEs;
transmit a downlink communication; and
receive hybrid automatic repeat request (HARD) acknowledgment (HARQ-ACK) feedback for the downlink communication based at least in part on the UE applying digital post distortion (DPoD) correction that is based at least in part on measurements of the one or more downlink communications transmitted to the one or more additional UEs and the one or more indications of the parameters.

14. The network entity of claim 13, wherein the one or more downlink communications and the downlink communication are frequency division multiplexed by a transmitting device.

15. The network entity of claim 13, wherein the one or more downlink communications and the downlink communication are transmitted via a same downlink beam, or
wherein the one or more downlink communications are transmitted via a first downlink beam and the downlink communication are transmitted via a second downlink beam that is within a threshold transmission angle from the network entity.

16. The network entity of claim 13, wherein the one or more indications of parameters comprise one or more of:
an indication of frequency domain resource assignment,
an indication of time domain resource assignment,
an indication of one or more antenna ports,
an indication of demodulation reference signal (DMRS) sequence initialization, an indication of scrambling identifications,
an indication of phase tracking reference signal parameters, or
an indication of channel state information reference signals (CSI-RS) parameters.

17. The network entity of claim 13, wherein the one or more processors, to transmit the one or more indications of parameters, are configured to:
transmit a first set of the one or more indications of parameters via one or more downlink control information (DCI) messages,
transmit a second set of the one or more indications of parameters via one or more radio resource control (RRC) messages, or
transmit a third set of the one or more indications of parameters via one or more medium access control (MAC) control elements (CEs).

18. The network entity of claim 17, wherein the one or more processors, to transmit the first set of the one or more indications of parameters via one or more downlink control information (DCI) messages, are configured to:
transmit one or more radio network temporary identifiers (RNTIs) associated with the one or more additional UEs; or
transmit the one or more DCI messages that are associated with the one or more additional UEs.

19. The network entity of claim 17, wherein the one or more processors, to transmit the first set of the one or more indications of parameters via one or more downlink control information (DCI) messages, are configured to:

transmit a DCI message, addressed to the UE, that indicates the first set of one or more indications of parameters, or transmit a common DCI message, addressed to the UE and the one or more additional UEs, that indicates the first set of one or more indications of parameters.

20. The network entity of claim 13, wherein the one or more processors, to transmit the one or more indications of parameters, are configured to:

transmit, via radio resource control (RRC) signaling or a medium access control (MAC) control element (CE), a set of the one or more indications of parameters that are associated with a set of candidate additional UEs that includes the one or more additional UEs; or transmit, via dynamic signaling, an indication of selection of the one or more additional UEs from the set of candidate additional UEs.

21. The network entity of claim 20, wherein the indication of the selection of the one or more additional UEs includes an indication of radio network temporary identifiers (RNTIs) of the one or more additional UEs or an indication of a hash of the RNTIs of the one or more additional UEs.

22. The network entity of claim 21, wherein the one or more processors, to transmit the set of the one or more indications of parameters that are associated with the set of candidate additional UEs, are configured to:

transmit a groupcast message, addressed to the UE and the one or more additional UEs, that indicates the set of the one or more indications of parameters that are associated with the set of candidate additional UEs.

23. The network entity of claim 21, wherein the set of candidate additional UEs are associated with a same downlink beam, or wherein the set of candidate additional UEs are associated with downlink beams within a threshold transmission angle.

24. A method of wireless communication performed by a user equipment (UE), comprising:

receiving one or more indications of parameters associated with one or more downlink communications transmitted to one or more additional UEs; and receiving a downlink communication, including applying digital post distortion (DPoD) correction based at least in part on measurements of the one or more downlink communications transmitted to the one or more additional UEs and the one or more indications of the parameters.

25. The method of claim 24, wherein applying the DPoD correction comprises one or more of:

estimating a channel that includes allocations for the one or more downlink communications and the downlink communication, estimating constellation points of signals associated with the channel, equalizing the signals, estimating non-linearities of the signals, or correcting for the non-linearities of a portion of the signals that are associated with the downlink communication.

26. The method of claim 24, wherein the one or more indications of parameters comprise one or more of:

an indication of frequency domain resource assignment, an indication of time domain resource assignment, an indication of one or more antenna ports, an indication of demodulation reference signal (DMRS) sequence initialization, an indication of scrambling identifications, an indication of phase tracking reference signal parameters, or an indication of channel state information reference signals (CSI-RS) parameters.

27. The method of claim 24, wherein receiving the one or more indications of parameters comprises one or more of:

receiving, via radio resource control (RRC) signaling or a medium access control (MAC) control element (CE), a set of the one or more indications of parameters that are associated with a set of candidate additional UEs that includes the one or more additional UEs; or receiving, via dynamic signaling, an indication of selection of the one or more additional UEs from the set of candidate additional UEs.

28. A method of wireless communication performed by a network entity, comprising:

transmitting, to a user equipment (UE), one or more indications of parameters associated with one or more downlink communications transmitted to one or more additional UEs;

transmitting a downlink communication; and receiving hybrid automatic repeat request (HARD) acknowledgment (HARQ-ACK) feedback for the downlink communication based at least in part on the UE applying digital post distortion (DPoD) correction that is based at least in part on measurements of the one or more downlink communications transmitted to the one or more additional UEs and the one or more indications of the parameters.

29. The method of claim 28, wherein the one or more indications of parameters comprise one or more of:

an indication of frequency domain resource assignment, an indication of time domain resource assignment, an indication of one or more antenna ports, an indication of demodulation reference signal (DMRS) sequence initialization, an indication of scrambling identifications, an indication of phase tracking reference signal parameters, or an indication of channel state information reference signals (CSI-RS) parameters.

30. The method of claim 28, wherein transmitting the one or more indications of parameters comprises one or more of:

transmitting, via radio resource control (RRC) signaling or a medium access control (MAC) control element (CE), a set of the one or more indications of parameters that are associated with a set of candidate additional UEs that includes the one or more additional UEs; or transmitting, via dynamic signaling, an indication of selection of the one or more additional UEs from the set of candidate additional UEs.

* * * * *